United States Patent
Vashchenko et al.

(10) Patent No.: US 6,717,219 B1
(45) Date of Patent: Apr. 6, 2004

(54) HIGH HOLDING VOLTAGE ESD PROTECTION STRUCTURE FOR BiCMOS TECHNOLOGY

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/121,183

(22) Filed: Apr. 12, 2002

(51) Int. Cl.[7] .............................................. H01L 23/62
(52) U.S. Cl. ...................... 257/355; 257/107; 257/110; 257/343; 257/362
(58) Field of Search ................................ 257/355, 107, 257/110, 343, 362

(56) References Cited

U.S. PATENT DOCUMENTS

| | | | | |
|---|---|---|---|---|
| 5,028,977 A | * | 7/1991 | K. O. Kenneth et al. | 357/43 |
| 5,406,104 A | * | 4/1995 | Hirota et al. | 257/351 |
| 5,461,242 A | * | 10/1995 | Muraoka et al. | 257/136 |
| 5,545,909 A | * | 8/1996 | Williams et al. | 257/355 |
| 5,814,858 A | * | 9/1998 | Williams | 257/328 |
| 5,815,359 A | * | 9/1998 | Maytum et al. | 361/111 |
| 5,850,095 A | * | 12/1998 | Chen et al. | 257/361 |
| 5,883,414 A | * | 3/1999 | Ito | 257/355 |
| 5,907,174 A | * | 5/1999 | Lee et al. | 257/357 |
| 6,355,959 B1 | * | 3/2002 | Vashchenko et al. | 257/355 |
| 6,489,653 B2 | * | 12/2002 | Watanabe et al. | 257/343 |
| 2001/0025961 A1 | * | 10/2001 | Nakamura et al. | 257/107 |
| 2003/0006464 A1 | * | 1/2003 | Heyn et al. | 257/362 |
| 2003/0047750 A1 | * | 3/2003 | Russ et al. | 257/173 |

FOREIGN PATENT DOCUMENTS

| | | | |
|---|---|---|---|
| EP | 843 355 | * | 5/1998 |
| EP | 1 130 652 | * | 9/2001 |
| JP | 5-94996 | * | 4/1993 |

* cited by examiner

Primary Examiner—Jordan J. Flynn
Assistant Examiner—Ahmed N. Sefer
(74) Attorney, Agent, or Firm—Jurgen Vollrath

(57) ABSTRACT

In a Bi-CMOS ESD protection structure, the holding voltage is increased by a desired amount by including a NBL of chosen length. The positioning of the NBL may be adjusted to adjust the I–V characteristics of the structure. Dual voltage capabilities may be achieved by providing two laterally spaced p-regions in a n-material and defining a n+ region and a p+ region in each of the p-regions to define I–V characteristics that are similar to those defined by a SCR device in a positive direction, but, in this case, having those characteristics in both directions. Over and above the NBL position being adjusted relative to the p-regions, the two p-regions may vary in doping level, and dimensions to achieve different I–V characteristics for the device in the positive and negative directions.

3 Claims, 3 Drawing Sheets

HIGH HOLDING VOLTAGE ESD PROTECTION STRUCTURE FOR BICMOS TECHNOLOGY

FIELD OF THE INVENTION

The invention relates to ESD protection devices. More particularly, it relates to ESD protection devices that are implemented using BiCMOS technology.

BACKGROUND OF THE INVENTION

Analog circuits typically display sensitivity to excessive voltage levels. Transients, such as electrostatic discharges (ESD) can cause the voltage handling capabilities of the analog circuit to be exceeded, resulting in damage to the analog circuit. ESD protection devices have, therefore, been devised to shunt current to ground during excessive voltage peaks.

In the case of BiCMOS technology, it is clearly preferable that the protection device be implemented using standard BiCMOS process techniques. Furthermore, one of the difficulties encountered in designing such protection circuitry is that the specifications for these clamps have to fit within a relatively small design window that, on the one hand, must take into account the breakdown voltage of the circuit being protected, and, on the other hand, avoid latch-up under normal operation. Thus, the clamp must be designed so as to be activated below the breakdown voltage of the circuit that is to be protected. At the same time, the latch-up or holding voltage must exceed the normal operating voltage of the protected circuit.

One possible ESD protection device involves the use a silicon-controlled rectifier (SCR). This is a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage. As a result of these characteristics, SCRs have been used to provide ESD protection, in which the first node corresponds to a to-be-protected node, and the second node is typically connected to ground. The SCR operates within an ESD protection window that has a maximum voltage defined by the destructive breakdown level of the to-be-protected node, and a minimum voltage (also known as a latch-up voltage) defined by any dc bias on the to-be-protected node.

Thus, when the voltage across the to-be-protected node and the second node is less than the trigger voltage, the SCR provides an open circuit between the to-be-protected node and the second node. However, when the to-be-protected node receives a voltage spike that equals or exceeds the trigger voltage, such as when an ungrounded human-body discharge occurs, the SCR provides a low-resistance current path from the to-be-protected node to the second node. In addition, once the ESD event has passed and the voltage on the to-be-protected node falls below the holding voltage, the SCR again provides an open circuit between the to-be-protected node and the second node.

However, a disadvantage of a SCR is that it typically displays a very low holding voltage, thus exposing the device to latch-up. Therefore, the SCR may remain in conduction after an ESD pulse if the voltage does not drop back down to below the holding voltage. For example, the bias voltage may keep the voltage above the holding voltage. Since the SCR is designed for short, high current pulses, extended conduction during normal operation can cause hot carrier degradation and ultimately failure of the device.

It is therefore desirable to have a protection structure that has a high holding voltage.

Another issue is providing protection for dual output circuits. In the case of BiCMOS output interface circuits that allow dual polarity of the output voltage amplitude (so-called "swing"), conventional triggering ESD structures such as SCRS, LVTSCRs, GGNMOS, TFO devices and even diode pairs are unsuitable. When these devices are reverse biased or a reverse power supply is applied, a substantial amount of power is consumed by the internal diode structure, as is discussed in greater detail below.

The ESD protection device or triggering structure for dual polarity applications should therefore display an S-shaped I–V characteristic for voltage swings in both directions. Bi-directional thyristor devices such as TRIACs (triode AC switches) and DIACS (diode AC switches) (for example AC trigger diodes and bi-directional p-n-p-n diode switches) exist that provide for bi-direcdonal voltage swings. However, as mentioned above, ESD protection devices require specific functional specifications in order to operate within a specific window. The triggering voltage may not be too high, to avoid damage to the circuit being protected. Also, the triggering structure must not remain in conduction once the ESD pulse has passed and normal voltages resume. Thus, the holding voltage of the device must, again, be sufficiently high to avoid latch-up during normal operation.

The present invention provides a method and triggering ESD SCR structure that can readily be implemented in BiCMOS technology and which provides an increased holding voltage or bi directional voltage swings. The present invention also provides a method and triggering structure that displays a high holding voltage and is suitable of protecting circuits that experience dual voltage swings.

SUMMARY OF THE INVENTION

The present invention provides both a SCR structure and a Bi-CMOS ESD protection structure with dual voltage capabilities, wherein the structures provide increased holding voltages over conventional SCR devices. This is achieved by providing a n-buried layer (NBL) of suitable length in the structure.

The dual voltage device is created by forming two laterally spaced p-regions in a n-material and defining a n+ region and a p+ region connected by a common contact, in each of the p-regions. In this way a device is defined that has I–V characteristics that are similar to those defined by a SCR device in a positive direction, but, in this case, having those characteristics in both directions. The device may be asymmetrical to accommodate different voltage amplitudes in the positive and negative directions.

According to the invention, there is provided a SCR with a high holding voltage comprising a SCR structure in which a n-buried layer (NBL) has been formed, wherein the length of the NBL is chosen to provide a desired holding voltage.

Further, according to the invention, there is provided a SCR structure, comprising a p-region formed in a n-epitaxial layer, a n-region formed in the n-epitxial layer, a first n+ region and a first p+ region formed in the p-region, and connected by a first common contact, a second n+ region and a second p+ region formed in the n-region, and connected by a second common contact, and a n-buried layer (NBL) formed in the n-material. The NBL may be symmetrically or asymmetrically located relative to the n-region and the p-region.

Further, according to the invention, there is provided a bi-directional ESD protection structure having a first p-region formed in a n-material; a second p-region formed in the n-material and laterally spaced from the first p-region; a first n+ region and a first p+ region formed in the first p-region, and connected by a first common contact, a second n+ region and a second p+ region formed in the second p-region, and connected by a second common contact, and a n-buried layer formed in the n-material. One or both of the p-regions may comprises a p-deep region, a p-well, or a p-body. A shallow trench isolation region or thick field oxide may be formed between the first p-region and the second p-region. Furthermore, a sinker region may be formed between the first p-region and the second p-region.

Further, according to the invention, there is provided a method of forming a bi-directional ESD protection device, comprising providing a semiconductor substrate, n-doping at least part of the semiconductor substrate to form n-material, masking and doping the n-material to define a first and a second p-region in the n-material that are laterally spaced from each other, forming a n+ region and a p+ region laterally spaced from each other, in each of the two p-regions, providing a common contact for both of the n+ region and p+ region of the two p-regions, and providing a n-buried layer (NBL) in the n-material. The size of the NBL may be chosen to provide the desired holding voltage, and the location of the NBL may be chosen to provide different I–V characteristics in the positive and the negative directions. Ideally BiCMOS technology is used in the process steps. Typically the n+ region and p+ region in each of the p-regions are formed by masking and doping the p-regions. The p-regions may be defined by one or more of a p-well, p-body, collector, or p-deep type implant. The method may include n-doping the region between the p-regions to define a higher doped region between the p-regions, for example, forming a sinker region between the p-regions. The size and location of the higher doped region between the p-regions may be chosen to achieve desired triggering and holding voltage characteristics for the device. The method may further include forming one or more ISO or lightly doped regions in the n-material. Also, the first p-region may be different from the second p-region to define an asymmetrical structure. This difference in the p-regions may be in one or more of the doping level, thickness, and width of the p-regions.

DETAILED DESCRIPTION OF THE INVENTION

One embodiment of the invention provides a triggering structure in the form of a modified SCR. An understanding of the operation of a SCR is therefore useful. It operates by providing an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage. When used for ESD protection, the SCR is connected with the first node connected to the circuit being protected, and the second node typically connected to ground. It operates within an ESD protection window that has a maximum voltage defined by the destructive breakdown level of the to-be-protected node, and a minimum voltage (also known as holding voltage) dictated by any dc bias on the circuit being protected.

Thus, when the voltage across the first node and the second node is less than the trigger voltage, the SCR provides an open circuit. However, when the first node receives a voltage spike that equals or exceeds the trigger voltage, such as when an ungrounded human-body discharge occurs, the SCR provides a low-resistance current path from the first node to the second node. In addition, once the ESD event has passed and the voltage on the first node falls below the holding voltage, the SCR again provides an open circuit between the to-be-protected node and the second node.

Figure 1:
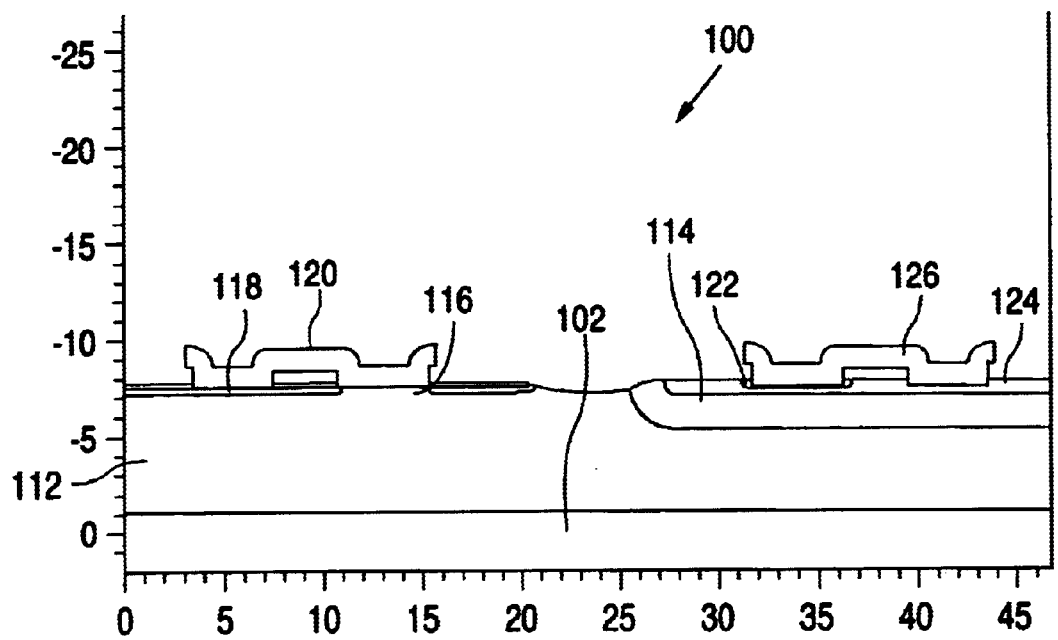
FIG. 1 is a cross-sectional view of one embodiment of a SCR-like structure of the invention.

FIG. 1 shows a cross-sectional view that illustrates a modified SCR 100 of the invention with its n-buried layer (NBL) 102. As shown in FIG. 1, SCR 100 has a n-material region 112 which, in this embodiment, is a n-layer such as a n-epitaxial layer. In some embodiments this is formed in a p-material (not shown in this embodiment). A p-region 114 is formed in the n-material 112. A n+ region 116 and a p+ region 118 are formed in the n-material 112. The n+ and p+ regions 116 and 118 are both connected to a common contact 120 which, in practice, is connected to the first node. As further shown in FIG. 1, SCR 100 also has a n+ region 122 and a p+ region 124 formed in p-region 114. The n+ and p+ regions 122 and 124 are connected by a common contact 126 and, in practice are connected to the second node.

In operation, when the voltage across the contacts 120 and 126 is positive and less than the trigger voltage, the voltage reverse biases the junction between n-material 112 and p-region 114. The reverse-biased junction, in turn, blocks charge carriers from flowing from node 120 to node 126. However, when the voltage across contacts 120 and 126 is positive and equal to or greater than the trigger voltage, the reverse-biased junction breaks down due to avalanche multiplication.

The brekdown of the junction causes a large number of holes to be injected into p-region 114, and a large number of electrons to be injected into n-material 112. The increased number of holes increases the potential of p-region 114 in the region that lies adjacent to n+ region 122, and eventually forward biases the junction between p-region 114 and n+ region 122.

When the increased potential forward biases the junction, a npn transistor that utilizes n+ region 122 as the emitter, p-region 114 as the base, and n-material 112 as the collector turns on. When turned on, n+ (emitter) region 122 injects electrons into (base) material 114. Most of the injected electrons diffuse through (base) material 114 and are swept from (base) material 114 into (collector) n-material 112 by the electric field that extends across the reverse-biased junction. The electrons in (collector) n-material 112 are then collected by n+ region 116.

A small number of the electrons injected into (base) material 114 recombine with holes in (base) material 114 and are lost. The holes lost to recombination with the injected electrons are replaced by holes injected into (base) material 114 by the broken-down reverse-biased junction and, as described below, by the collector current of a pnp transistor, thereby providing the base current.

The electrons that are injected and swept into n-material 112 also decrease the potential of n-material 112 in the region that lies adjacent to p+ region 118, and eventually forward bias the junction between p+ region 118 and n-material 112. When the decreased potential forward biases the junction between p+ region 118 and n-material 112, a pnp transistor formed from p+ region 118, n-material 112, and p-region 114, turns on.

When turned on, p+ emitter 118 injects holes into base 112. Most of the injected holes diffuse through n-material (base) 112 and are swept from n-well (base)112 into p-region (collector) 114 by the electric field that extends across the reverse-biased junction. The holes in collector 114 are then collected by p+ region 124.

A small number of the holes injected into n-material (base) 112 recombine with electrons in n-material 112 and are lost. The electrons lost to recombination with the injected holes are replaced by electrons flowing into n-material 112 as a result of the broken-down reverse-biased junction, and n-material 112 being the emitter of the npn transistor. Thus, a small part of the npn collector current forms the base current of the pnp transistor.

Similarly, as noted above, the holes swept into p-region 114 also provide the base current holes necessary to compensate for the holes lost to recombination with the diffusing electrons injected by n+ (emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 118 injects holes that provide both the holes for the collector current of the pnp transistor as well as the holes for the base current of the npn transistor. Thus the SCR provides for double injection by n+ region 122 and p+ region 118 of SCR 100, providing for very high current densities.

However, in the absence of the n-buried layer (NBL) 102, the SCR would display a very low holding current, making it susceptible to latch-up. By including the NBL 102, the holding current can be significantly increased. This can be understood by considering the NBL 102 as providing the collector for a vertical npn transistor. Instead of having only a lateral npn transistor defined by the n+ region 122, the p-region 114, and the n-material 112, there is now also a npn transistor defined by the n+ region 122, the p-region 114, and the NBL 102. This provides an alternative path for the electrons. Thus the number of holes and electrons in the n-material are no longer substantially the same. This causes the electric field across the n-region to increase, resulting in an increased holding voltage.

Figure 2:
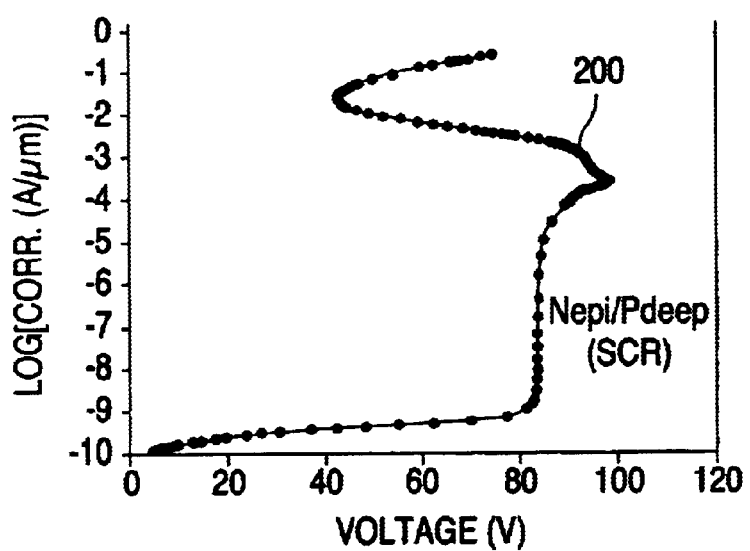
FIG. 2 is the I–V characteristic for the SCR-like structure of FIG. 1.

The resultant I–V characteristics of the SCR are shown in FIG. 2 which shows a S-shaped curve having a holding voltage of nearly 40 V, instead of the approximately 1.5 V holding voltage of traditional SCRs. The SCR structure of the invention therefore provides an ESD protection structure that is highly suitable for the protection of powered output devices in which latch-up can be avoided after an ESD event during powered operation.

The above embodiment, however, is unsuitable for bi-directional use. When the SCR experiences a voltage pulse in the opposite direction, the structure acts simply as a forward biased diode due to the forward biased junction between p-region 114 and n-material 112. This results in large power dissipation due to the resulting large currents.

Figure 3:
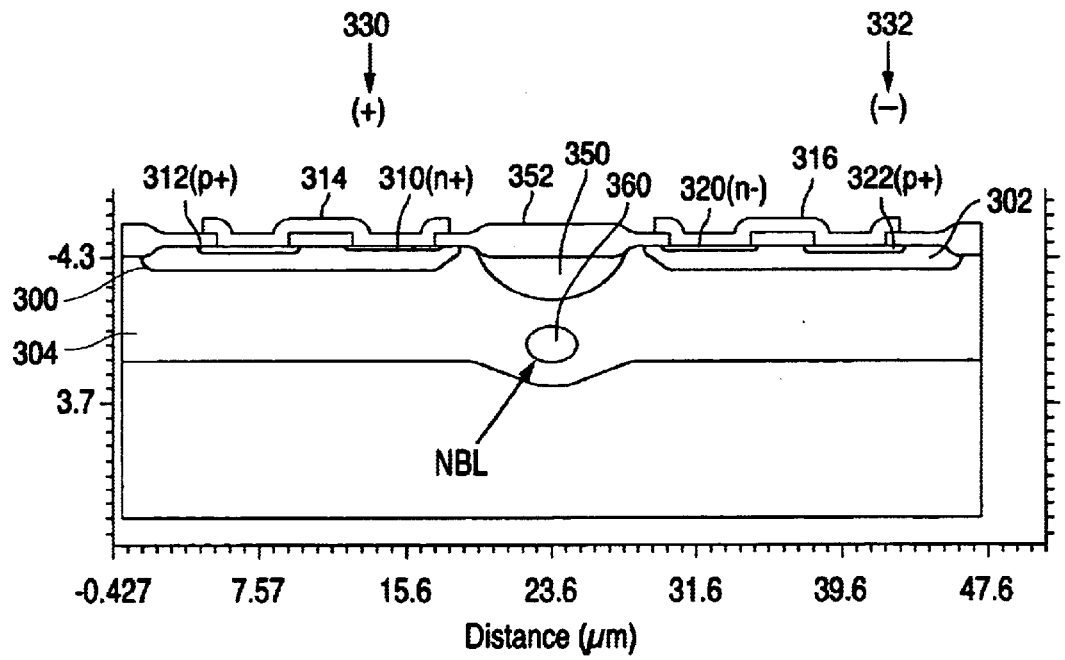
FIG. 3 is a cross-sectional view of one embodiment of a bi-directional triggering structure of the invention.

One embodiment of a bi-directional structure of the present invention is shown in FIG. 3. It includes a p-body 300 and a p-body 302 formed in a n-epitaxial region 304, and spaced laterally from each other. In another embodiment, the p-body regions 300, 302 were separated by a thick field oxide or shallow trench isolation (STI) region. A n+ region 310 and a p+ region 312 are formed in the p-body 300. Similarly, n+ region 320 and a p+ region 322 are formed in the p-body 302. Thus, this embodiment of the invention provides a symmetrical structure with two p-regions 300, 302. While the embodiment of FIG. 3 speaks of a p-body regions, it will be appreciated that these p-regions can be created by any process step(s) commonly used in a BiCMOS process, such as deep well, body, collector, or other type implant. The n+ region 310 and p+ region 312 are connected by a common contact 314 to define the anode, and the n+ region 320 and p+ region 322 are connected by a common contact 316 to define the cathode. The structure also includes a n-sinker region 350 formed below the locus 352, between the p-body regions 300, 302. This provides for a lower breakdown voltage, which will occur below the original zener diode breakdown voltage created by the junction between the p-body 302 and n-epitaxial region 304. In another embodiment of the invention, the structure was implemented without the n-sinker region.

In order to provide for an increased holding voltage, the structure of FIG. 3 includes a n-buried layer (NBL) 360. In this embodiment the NBL is rather short. However, the invention contemplates adjusting the length of the NBL to provide the desired holding voltage. For instance, the embodiment illustrated in FIG. 4 shows a longer NBL 460.

Prior to avalanche breakdown the structure is equivalent to a PNP bipolar transistor with the p+ region 300 acting as emitter, the n-epitaxial region as the base, and the p+ region 302 as the collector. The junction between the n+ region 310 and n-epitaxial region 304 is reverse biased at this stage and, therefore, blocks the current and determines the leakage. However, at the voltage level of avalanche breakdown, this lateral junction produces an avalanche current. The breakdown of the junction causes a large number of holes to be injected into the p-body material 302, and a large number of electrons to be injected into n+ region 310. The increased number of holes increases the potential of the material 302 in the region that lies adjacent to the n+ region 320, and eventually forward biases the junction between n+ region 320 and p-body 302. This results in a npn transistor in which electrons are injected from the emitter 320 into the base 302 to turn the transistor on. Electrons are injected into the n-epi 304. Some electrons combine with holes in the n-epi 304 but most are swept across to the n+ region 310 at the cathode 330. This also reduces the potential of the n-epi 304 in the region of the p-body 300. This results in a pnp transistor which injects holes from the emitter 312 into the base 304 and causes most of the holes to be swept across to the p-body 302 further turns on the base of the npn transistor. Thus, due to the positive feedback, a deep bipolar conductivity modulation is created between the anode 330 and the cathode 332, which results in space charge modulation, electric field dumping, avalanche ionization, and eventually double injection conductivity. The NBL has the effect of diverting some of the electrons injected from the emitter 320, by defining another collector. Thus, the NBL defines a vertical npn transistor in which the n+ region 320 acts as emitter, p-body 302 acts as base, and NBL 360 acts as collector. The effect of this is that the number of holes and electrons in the n-epitaxial region 304 are no longer substantially the same. Thus the electric field increases across the n-epitaxial region 304, resulting in an increased holding voltage for the structure.

Due to the symmetrical nature of the structure, a S-shaped curve is achieved for both a positive and a negative voltage pulse.

Figure 4:
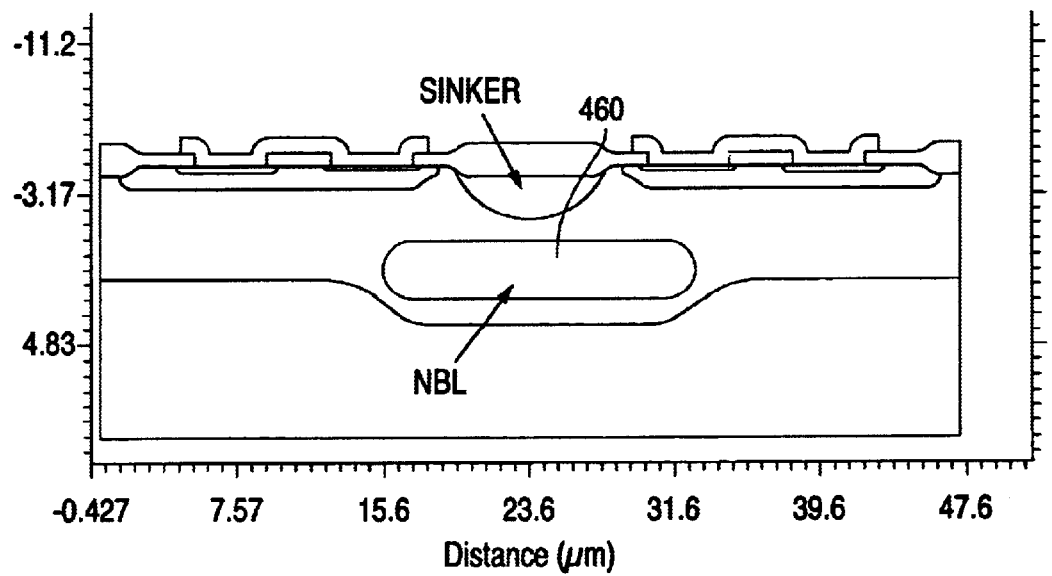
FIG. 4 is a cross-sectional view of another embodiment of a bi-directional triggering structure of the invention.
Figure 5:
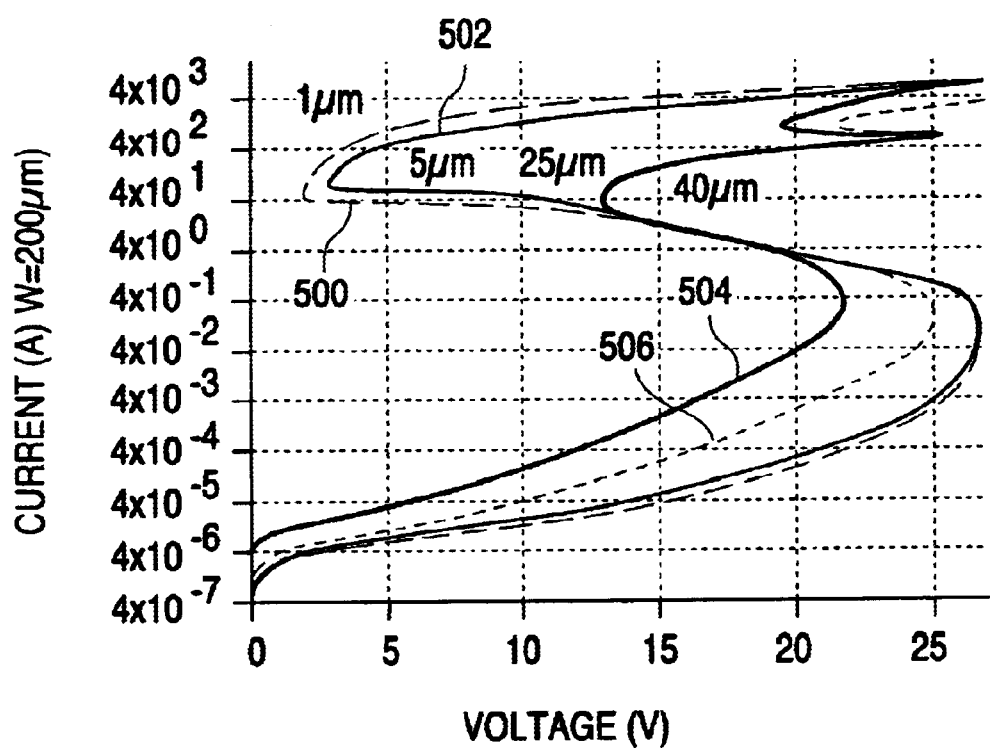
FIG. 5 shows the I–V characteristic of various embodiments of the bi-directional triggering structure of the invention.

FIG. 5 shows simulated results only the positive side of the I–V characteristics of various embodiments of the invention shown in FIGS. 3 and 4, for different NBL lengths. Curve 500 shows the I–V characteristics with a NBL of 1 µm length, curve 502 shows the characteristics for a NBL of 5 µm, curve 504 shows the characteristics for a NBL of 25 µm, and curve 506 shows the characteristics for a NBL of 40 µm. Thus, a significant increase in holding voltage is achieved by increasing the NBL length from 5 µm to 25 µm . This increase in holding voltage with increased NBL length was also borne out by actual test results.

In many cases the output voltage is not symmetrical, but has different voltage amplitudes for the positive and negative voltages. In order to handle the different voltage amplitudes, different doping profiles can be created at the lateral junctions, using existing process implants. These may include the inclusion of a n-lightly doped region (commonly referred to n-lightly doped drain (NLDD) where it is associated with the drain of a transistor device), ISO, etc. Variations in the I–V characteristics can also be achieved by shifting the mask position during doping. For example the NBL, ISO, NLDD, etc. can be laterally shifted to form an asymmetric structure with asymmetric characteristics. Either one or both of these approaches allows desirable breakdown and triggering voltages and holding voltages to be achieved on each side (positive and negative voltage pulse).

Experimental results have shown that the present invention allows a bi-directional structure to be created in accordance with the invention, which has a protection capability of more than 10A 200 µm , thus making it possible to provide protection against an ESD voltage pulse of more than 15 kV.

It will be appreciated that the invention can be implemented in using different dopings for the p-regions and the n-region between the p-regions, and that different process techniques can be used to achieve this. Also, it will be appreciated that the doping mask can be shifted. Thus the appropriate triggering and holding voltages can be achieved for positive and negative voltage pulses.

It will also be appreciated that, while the embodiments discussed above shown-epitaxial region in a p-substrate, the invention could be implemented so that the p-body, p-well, p-deep, or other p-regions formed in the n-material are formed in a n-substrate, n-well or other n-region other than a n-epitaxial region. For simplicity the term n-material will be used in the claims to define any type of n-region that the p-body, p-well, p-deep, or other p-regions are formed in.

What is claimed is:

1. An ESD protection structure, comprising a first p-region formed in a n-material and defining an anode;

a second p-region formed in the n-material and laterally spaced from the first p-region, and defining a cathode;

a first n+ region and a first p+ region formed in the first p-region, and connected by a first common contact, a second n+ region and a second p+ region formed in the second p-region, and connected by a second common contact, a n-buried layer (NBL) formed in the n-material, and a sinker region located between the first p-region and the second p-region, wherein the NBL and sinker region do not contact each other.

2. An ESD protection structure of claim 1, wherein the first p-region comprises any one of a p-deep region, a p-well, or a p-body, and the second p-region comprises any one of a p-deep region, a p-well, or a p-body.

3. An ESD protection structure of claim 1, wherein a thick field oxide or shallow trench isolation region is formed between the first p-region and the second p-region.

* * * * *